(12) United States Patent
Yen et al.

(10) Patent No.: US 6,953,536 B2
(45) Date of Patent: Oct. 11, 2005

(54) LONG PERSISTENT PHOSPHORS AND PERSISTENT ENERGY TRANSFER TECHNIQUE

(75) Inventors: William M. Yen, Athens, GA (US); Dongdong Jia, Troy, NY (US); Weiyi Jia, Mayaguez, PR (US); Xiao-jun Wang, Statesboro, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 16 days.

(21) Appl. No.: 10/374,696

(22) Filed: Feb. 25, 2003

(65) Prior Publication Data

US 2004/0164277 A1 Aug. 26, 2004

(51) Int. Cl.$^7$ .................. C09K 11/59; C09K 11/64; C09K 11/55
(52) U.S. Cl. .................. 252/301.4 F; 252/301.4 R
(58) Field of Search ............ 252/301.4 R, 301.4 F

(56) References Cited

U.S. PATENT DOCUMENTS

| | | | |
|---|---|---|---|
| 3,294,699 A | | 12/1966 | Lange .................. 252/301.4 |
| 3,676,361 A | * | 7/1972 | Datta .................. 252/301.4 F |
| 4,110,660 A | | 8/1978 | Wolfe .................. 313/486 |
| 4,249,108 A | | 2/1981 | Wolfe .................. 313/486 |
| 4,495,085 A | | 1/1985 | Hashimoto et al. ... 252/301.4 F |
| 4,623,816 A | | 11/1986 | Hoffman et al. ........... 313/487 |
| 4,733,126 A | | 3/1988 | Yamakawa et al. ......... 313/487 |
| 5,350,971 A | | 9/1994 | Jeong .................. 313/487 |
| 5,358,734 A | | 10/1994 | Lenox et al. ................ 427/71 |
| 5,376,303 A | | 12/1994 | Royce et al. ......... 252/301.4 R |
| 5,424,006 A | * | 6/1995 | Murayama et al. ... 252/301.4 R |
| 6,010,644 A | | 1/2000 | Fu et al. ............. 252/301.4 R |
| 6,093,346 A | | 7/2000 | Xiao et al. ........... 252/301.4 F |
| 6,099,754 A | * | 8/2000 | Yocom ................ 252/301.4 F |
| 6,117,362 A | | 9/2000 | Yen et al. ............. 252/301.4 R |
| 6,267,911 B1 | * | 7/2001 | Yen et al. ............. 252/301.4 R |
| 6,617,781 B2 | | 9/2003 | Murazaki et al. ........... 313/486 |
| 2003/0124383 A1 | * | 7/2003 | Akiyama et al. ........... 428/690 |

FOREIGN PATENT DOCUMENTS

| | | |
|---|---|---|
| CN | 94117228 | 10/1994 |
| CN | 98105078 | 3/1998 |
| EP | 0 241 848 | 3/1990 |
| EP | 0 418 902 A2 | 3/1991 |
| EP | 710709 A1 | 6/1996 |
| EP | 765925 A1 | 4/1997 |
| JP | 51-31037 | 4/1976 |
| JP | 76031037 | 4/1976 |
| JP | 82017034 | 8/1982 |
| JP | 5078659 | 3/1993 |
| JP | 94029416 | 2/1994 |
| JP | 94029417 | 2/1994 |
| JP | 08-151573 | 6/1996 |
| JP | 08170076 A | 7/1996 |
| JP | 54-78384 * | 6/1997 |
| WO | WO 02/083814 | 10/2002 |

OTHER PUBLICATIONS

Jia et al, "Green Phosphorescence of CaAl2O4:Tb3+, ce3+ Through Persistence Energy Transfer".*

(Continued)

*Primary Examiner*—C. Melissa Koslow
(74) *Attorney, Agent, or Firm*—Thomas, Kayden, Horstemeyer & Risley, LLP

(57) ABSTRACT

The invention provides long-persistent phosphors, methods for their manufacture and phosphorescent articles. The invention also provides a method for generating a long-persistent phosphorescence at a selected color. The phosphors of the invention may be alkaline earth aluminates, alkaline earth silicates, and alkaline earth aluminosilicates. The phosphors include those activated by cerium. The phosphors also include those in which persistent energy transfer occurs from a donor ion to an acceptor ion, producing persistent emission largely characteristic of the acceptor ion.

36 Claims, 12 Drawing Sheets

OTHER PUBLICATIONS

Academic Press Dictionary of Science and Technology (1992), Morris, C., ed., Academic Press, San Diego, pp. 282, 958, 1527, 1814, 2334, 2388.

Abbruscato, V. et al. (1971), "Optical and Electrical Properties of $SrAl_2O_4:Eu^{2+}$" J. Electrochem. Soc. 118(6):930–933.

Autrata, R. et al. (1983), "Single–Crystal Aluminates—A New Generation of Scintillators for Scanning Electron Microscopes and Transparent Screens in Electron Optical Devices," Scanning Electron. Microsc., pp. 489–500.

Babitskaya, R.A. et al. (1981), "Improvement and development of new effective luminophors having green and blue luminescence for gas discharge indicator panels," Chemical Abstracts 96:112888j (1982).

Blasse, G. and Grabmaier, B.C. (1994), in *Luminescent Materials*, Springer, Verlag, Berlin, Heidelberg, p. 1–5.

Chen, R. and McKeever, S.W.S. (1997), Theory of Thermoluminescence and Related Phenomena, World Scientific, Singapore, pp. 1–84.

Chemekova et al. (1977), "Synthesis of single crystals in the calcium oxide–alumina system," Terzisy Dokl. Vses. Soveshch. Rostu. Krist. $5^{th}$ 2:184–185 (Chem. Abst. (1980) 93:85423h).

Czochralski, J. (1918), "Ein neues Verfahren zur Messung der Kristallisationsgeschwindigkeit der Metalle," Z. Phys. Chem. 92:219–221.

Jia, D. et al. (Feb. 25, 2002), "Green phosphorescence of $CaAl_2O_4:Tb^{3+}$, $Ce^{3+}$ through persistence energy transfer," Appl. Phys. Lett. 80(9):1535–1537.

Jia, et al. (Jan. 2003), "Persistent energy transfer in $CaAl_2O_4:Tb^{3+}$, $Ce^{3+}$," J. Appl. Phys. 93:148–152.

Jia, D. et al. (Apr. 2002), "Site dependent thermoluminescence of long persistent phosphorescence of $BaAl_2O_4:Ce^{3+}$," Opt. Commun. 204(1–6):247–251 (Abstract Only).

Jia, W. (1998), "Phosphorescent dynamics in $SrAl_2O_4:Eu^{2+}$, $Dy^{3+}$ single crystal fibers," J. Luminescence 76 & 77:424–428.

Katsumata, T. et al. (1998), "Growth and characteristics of long persistent $SrAl_2O_4$– and $CaAl_2O_4$–based phosphor crystals by a floating zone technique," J. Cryst. Growth 183:361–365.

Katsumata, T. et al. (1998), "Characteristics of Strontium Aluminate Crystals Used for Long–Duration Phosphors," J. Am. Ceram. Soc. 81:413–416.

Katsumata, T. et al. (1997), "Effects of Composition on the Long Phosphorescent $SrAl_2O_4:Eu^{2+},Dy^{+}$ Phosphor Crystals," J. Electrochem. Soc. 144(9):L243–L245.

Kutty, T.R. et al. (1990), "Luminescence of the $Eu^{2+}$ in Strontium Aluminates prepared by the Hydrothermal Method," Mater. Res. Bull. 25:1355–1362.

Matsuzawa, T. et al. (1996), "A New Long Phosphorescent Phosphor with High Brightness, $SrAl_2O_4:Eu^{2+},Dy^{3+}$," J. Electrochem. Soc. 143(8):2670–2673.

Morgan and Yen (1989), "Laser Spectroscopy of Solids II," in *Topics in Applied Physics*, vol. 65, W.M. Yen, ed., Springer–Verlag, Berlin, pp. 77–122.

Ondracek, J. and Bohumil, H. (1991), "Some findings on blue–emitting luminophore based on (barium, europium(2+)) magnesium aluminate," Chemical Abstracts 116:161516b (1992).

Palilla, F.C. et al. (1968), "Fluroescent Properties of Alkaline Earth Aluminates of the Type $MAl_2O_4$ Activated by Divalent Europium," J. Electrochem. Soc. 115(6):642–644.

Pfann, W.G. (1952), "Principles of Zone–Melting," Trans. AIME 194:747–753.

Shionoya, S. (1998) in *Phosphor Handbook*, Shionoya, S. and Yen, W.M. (eds.), CRC Press, Inc., Boca Raton, New York, p. 3–8.

Smets, B. et al. (1989), "$2SrO·3Al_2O_3:Eu_{2+}$ and $1.29(Ba,Ca)O,6Al_2O_3:Eu^{2+}$. Two New Blue–Emitting Phosphors," J. Electrochem. Soc. 136(7):2119–2123.

Sonoda, M. et al. (1983), "Computed Radiography Utilizing Scanning Laser Stimulated Luminescence," Radiology 148:833–838.

Tissue, B.M. et al. (1991), "Laser–heated pedestal growth of laser and IR–upconverting materials," J. Cryst. Growth 109:323–328.

Yen, W.M. (1995) "Preparation of single crystal fibers," in *Insulating Materials for Optoelectronics*, F. Agullo–Lopez, ed., World Scientific, Singapore, Chapter 2, p. 29–53.

Zlotnikova et al. (1990), "Study of the dependence composition–luminescent properties of strontium aluminates activated by dysprosium," Ukr. Khim Zh. (Russ. Ed.) 56(11):1148–1151 (Chem. Abst. (1991)115:37798k).

Zorencko, Yu, V. et al. (1991), "The Peculiarities of Receiving of Thin Film Single Crystal Oxide Luminophores," Cryst. Properties and Preparation 36–38:226–233.

\* cited by examiner

LONG PERSISTENT PHOSPHORS AND PERSISTENT ENERGY TRANSFER TECHNIQUE

ACKNOWLEDGEMENT OF GOVERNMENT SUPPORT

This invention was made at least in part with U.S. government funding through Grant DMR 9986693 from the National Science Foundation. The United States government has certain rights in this invention.

BACKGROUND OF THE INVENTION

The present invention relates to long persistent phosphors and methods for their fabrication and use, as well as relating to phosphorescent articles incorporating the phosphors of the invention. The phosphors of the invention include alkaline earth aluminates, alkaline earth silicates, and alkaline earth aluminosilicates.

A wide variety of phosphors are known to the art. Persistent phosphorescing materials, such as ZnS:Cu, Co, ZnCdS:Cu and CaSrS:Bi, have been used for many years.

However, far fewer types of long persistence phosphors have been developed. These phosphors show a persistent afterglow emission or phosphorescence which can last for up to ten or more hours following a relatively brief period of ultraviolet excitation. Long persistence phosphors potentially have many technical applications.

Long persistent alkaline earth metal aluminate phosphors have been reported. Recent interest has centered on various aluminates doped with two rare earth ions, such as $SrAl_2O_4:Eu^{2+}, Dy^{3+}$, a green phosphor. These compounds are attractive from the point of view of chemical stability and low toxicity. A number of these materials have been commercialized for signing and novelty applications.

Strong green luminescence from $Eu^{2+}$-doped $SrAl_2O_4$ was reported by H. Lange in Belgian patent 1,347,45 and U.S. Pat. No. 3,294,696. Efficient luminescence in the spectral range 450–520 nm was also reported from $Eu^{2+}$-doped $CaAl_2O_4$, $MgAl_2O_4$, $BaAl_2O_4$, and $SrAl_2O_4$ and their counterparts using alkaline earth cationic combinations. (F. C. Palilla, A. K. Levine and M. R. Tomkus (1968) J. Electrochem. Soc. 115:642).

Long lasting and more efficient phosphorescence was reported in $Eu^{2+}$ doped $SrAl_2O_4$ synthesized with excess alumina which results in formation of trapping centers associated with the $Sr^{2+}$ vacancy (Abbruscato et al. (1971) J. Electrochem. Soc. 118:930).

Improved long persistence phosphors of certain alkaline earth aluminates were reported by T. Matsuzawa, Y. Aoki, N. Takeuchi and Y. Murayama (1996) J. Electrochem. Soc. 143(8):2670, and in U.S. Pat. No. 5,424,006. The brightness and persistence time of $SrAl_2O_4:Eu^{2+}$ was improved by co-doping various trivalent rare earth ions to produce appropriate trapping centers. The best result was reported for co-doping $Dy^{+3}$ with $Eu^{2+}$ into $SrAl_2O_4$ and $Nd^{+3}$ with $Eu^{2+}$ into $CaAl_2O_4$ to get long persistent green and purple emission, respectively. U.S. Pat. No. 5,424,006 also reports phosphors in which $Mg^{2+}$ is substituted for $Sr^{2+}$ in $SrAlO_4:Eu^{2+}, Dy^{3+}$.

U.S. Pat. No. 6,267,911 (Yen et al.) discloses long persistent alkaline earth aluminate green phosphors of the general form $M_kAl_2O_4$ activated by $Eu^{2+}$ in combination with at least one trivalent metal ion such as $Dy^{3+}$. M is an alkaline earth element such as Ca, Mg, Ba, or Sr. In these phosphors, k=1−2x−2y where x ranges from about 0.0001 to about 0.05 and y ranges from about x to about 3x.

U.S. Pat. No. 6,117,362 (Yen et al.) discloses long persistent alkaline earth aluminate blue phosphors of the general form $MO.mAl_2O_3$ activated by $Eu^{2+}$ in combination with at least one trivalent metal ion such as $Dy^{3+}$. M is an alkaline earth element such as Ca, Mg, Ba, or Sr. In this formula, m is a number ranging from about 1.6 to about 2.2.

EP published application 765,925 (Moriyama et al.) reports $Eu^{2+}$-activated strontium aluminate phosphors in which part of the $Sr^{2+}$ of the host is replaced with Pb, Dy or Zn ions. The zinc-doped materials are reported to display enhanced brightness and persistence compared to $SrAl_2O_4:Eu^{2+}, Dy^{3+}$.

EP published application 710,709 (Murayama et al.) reports phosphors of matrix $M_{1-x}Al_2O_{4-x}$ where M is at least one metal selected from calcium, strontium, barium and, optionally, magnesium, and x is a number not equal to 0. The matrix comprises europium as an activator and a co-activator elected from a rare earth metal, manganese, tin or bismuth.

JP Patent 76031037 (1976, Tokyo Shibaura Electric Co.) reports blue-emitting phosphors containing barium (or calcium or strontium)-potassium (or sodium) aluminates activated with europium and manganese.

JP Patent 94029417 (1994, Matsushita Electronics) reports a strontium aluminate phosphor activated with europium modified by incorporation of yttrium oxide.

JP Patent 94029416 (1994, Matsushita Electronics) reports a europium activated barium aluminate phosphor containing yttrium oxide to enhance phosphorescence.

Zlotnikova et at. (1990) Ukr. Khim Zh. (Russ. Ed.) 56(11):1148–1151 (Chem. Abst. (1991) 115:37798k) reports composition dependence of catho-luminescent properties of a Dy-doped $SrAl_2O_4$—$Sr\ Al_4O_7$ system.

T. R. Kutty et al. (1990) Mater. Res. Bull. 25:1355–1362 reports luminescence of $Eu^{2+}$ in strontium aluminates prepared by the hydrothermal method. Blue to green luminescent phosphors of general formula $Sr_nAl_2O_{3+n}$ where $n \leq 1$ or less are reported. The reference also reports the preparation of certain aluminoborates.

B. Smets et al. (1989) J. Electrochem. Soc. 136(7): 2119–2123 reports blue-emitting phosphors: $2SrO.3Al_2O_3:Eu^{2+}$ and $1.29 (Ba, Ca)O, 6Al_2O_3:Eu^{2+}$. In the background section of the reference the authors refer to an earlier report of blue-green emitting phosphors $4SrO.7Al_2O_3:Eu^{2+}$ and $BaO.4Al_2O_3:Eu^{2+}$ which could be synthesized only in the presence of small amounts of $B_2O_3$.

Chemekova et al. (1977) Terzisy Dokl. Uses. Soveshch. Rostu. Krist. 5th 2:184–185 (Chem. Abst. (1980) 93:85423h) reports synthesis of single crystals in the calcium oxide-alumina system. Addition of europium is said to produce phosphors.

Japanese published application number 08-151573 (1996, Nichia Chem. Ind. Ltd.), reports a calcium aluminate fluorescent substance additionally containing boron and optionally containing phosphorus. The aluminates also contain Eu, Nd and Mn, although Nd and Mn may be present in quantities as small as 0.00005. Drawing 1 of the published application shows an emission spectrum of a calcium aluminate containing Eu, Nd, Mn and boron. Immediately after excitation of the material is stopped, the material has emission peaks at 440 nm and 550 nm (curve a). The 440 peak is stated to be due to $Eu^{2+}$ and the 550 nm peak due to $Mn^{2+}$. Significantly, the amount of 550 nm luminescence decreases (curve b) after 20 minutes.

Persistent and long-persistent alkaline earth metal silicate phosphors formulated with boron or phosphorus have also been reported. U.S. Pat. No. 6,093,346 to Xiao et al. reports europium activated silicates of the formula: $aMO \cdot bM' \cdot cSiO_2 \cdot dR : Eu_xLn_y$ wherein M represents one or more elements selected from the group consisting of Sr, Ca, Ba, and Zn; M' represents one or more elements selected from the group consisting of Mg, Cd, and Be; R represents one or two components selected from $B_2O_3$ and $P_2O_5$; Ln represents one or more elements selected from the group consisting of Nd, Dy, Ho, Tm, La, Pr, Tb, Ce, Mn, Bi, Sn, and Sb; and wherein a, b, c, d, x, and y represent mole coefficients wherein $0.6 \leq a \leq 6$, $0 \leq b \leq 5$, $1 \leq c \leq 9$, $0 \leq d \leq 0.7$, $0.00001 \leq x \leq 0.2$, and $0 \leq y \leq 0.3$. The materials are stated to be capable of having an emission peak ranging from 450 nm to 580 nm when excited by short wavelength light, with the afterglow color being blue, bluish green, green, greenish-yellow, or yellow.

Long persistent alkaline earth metal alumino-silicates which are typically formulated with an alkaline halide, ammonium halide salt, and/or ammonium phosphates have also been reported. WO 02/083814 A1 (Su et al.) describes materials of the composite formula $MO \cdot aAl_2O_3 \cdot bSiO_3 \cdot cL : fX$, where M is SrO, CaO, BaO, and/or MgO, L is a mineralizer containing an alkaline halide, and/or an ammonium halide salt, and/or ammonium phosphates, and X is a rare-earth element activator.

SUMMARY OF THE INVENTION

This invention provides improved phosphors of alkaline earth aluminates, alkaline earth silicates, and alkaline earth aluminosilicates. The phosphors of the invention include long persistent phosphors doped with at least two different ions to form a donor system and an acceptor system. The donor system transfers optical energy to the acceptor system, which then emits energy in the form of light. These phosphors are termed "persistent transfer" phosphors. The donor and acceptor system can be selected so that energy is emitted from the phosphor at a desired wavelength. The phosphors of the invention long persistent phosphors doped with cerium and a suitable acceptor system as well long persistent phosphors doped with cerium alone. The invention also provides methods of making the phosphors of the invention in powder, ceramic, and single crystal form as well as methods for generating long persistent phosphorescence. The invention also provides phosphorescent articles.

The persistent transfer phosphors of the invention allow energy emission at the down-converted frequency of the acceptor system rather than the characteristic frequency of the donor system. In general, the conditions for conventional long persistent phosphors emitting in the blue and green are easier to fulfill than those for emitters in the longer wavelength, e.g. yellow and red. Though a few conventional red persistent phosphors exist, they generally employ sulfides with rare earth activators and are not conducive to many applications. Therefore, the invention allows another route to obtaining long persistent red emission by down-converting emission of another color to red emission.

In the persistent energy phosphors of the invention, the acceptor ion is selected from rare earth ions, transition metal ions, or heavy metal ions which give luminescence in the UV, visible, and IR regions when incorporated into the host material. Acceptor ions useful in the present invention include, but are not limited to, $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$. The donor emitter ion is selected from rare earth ions. Donor emitter ions useful in the present invention include, but are not limited to $Ce^{3+}$, $Pr^{3+}$, $Sm^{3+}$, $Eu^{2+}$, $Dy^{3+}$, and $Yb^{3+}$. In a given phosphor, the donor emitter ion is selected so that it is different from the acceptor emitter ion. The concentration of donor (D) and acceptor (A) ions determines the rate at which the transfer of optical energy occurs. An optional co-activator ion or ions may also be present. In a given phosphor, the co-activator ion or ions are selected so that they are different from the donor and the acceptor ions.

In general, the phosphors of the invention have a variety of applications for the manufacture of luminous materials such as paints, inks, plastic articles, toys, jewelry, ornaments, writing implements such as pens, pencils and crayons, and apparel. The phosphors of the invention can also be employed in night vision apparatus and in optoelectronic devices such as UV detectors and IR laser beam sensors. Preferred phosphors of the invention are chemically stable, resistant to moisture, and UV radiation. The phosphors of the invention are believed to be relatively harmless to the environment.

DETAILED DESCRIPTION OF THE INVENTION

Figure 1:
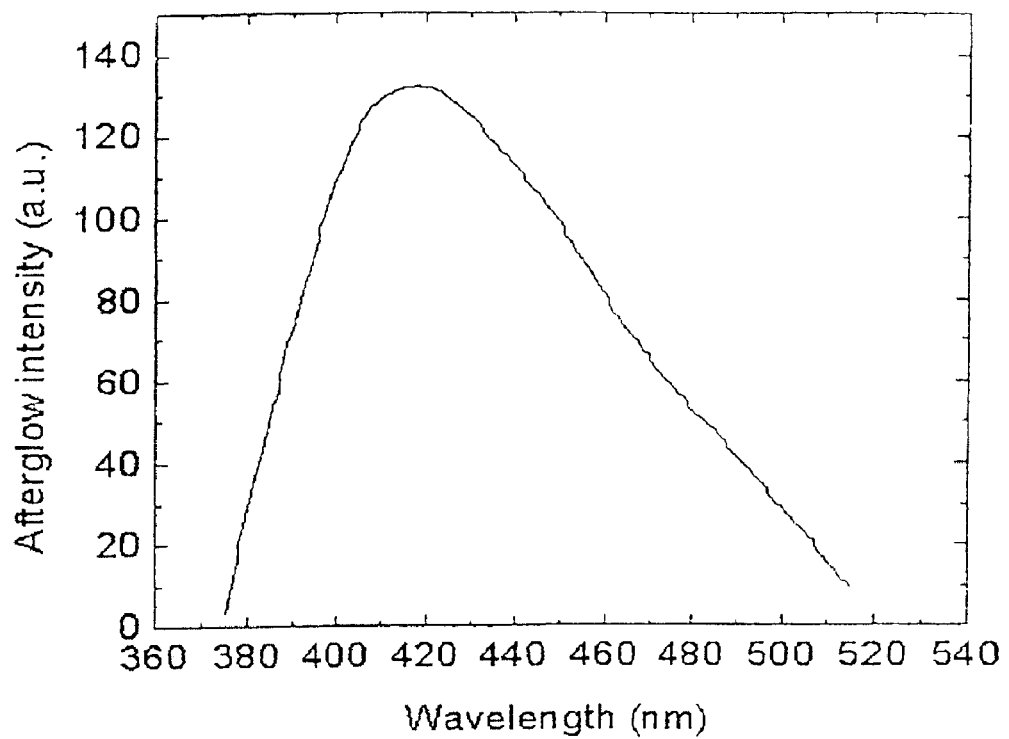
FIG. 1 shows the afterglow spectrum for single crystal $CaAl_2O_4 : Ce^{3+}$, which peaks about 413 nm (deep blue).

The invention relates to long persistent phosphors of alkaline earth aluminates, alkaline earth silicates, and alkaline earth aluminosilicates. The phosphors of the invention are based on the doping of one or more activators into the matrix or host. The phosphors of the invention include "persistent transfer" phosphors doped with at least two different ions to form a donor system and an acceptor system. The phosphors of the invention specifically include long persistent phosphors doped with cerium which are suitable for acting as a donor system. The invention also provides methods of making the phosphors of the invention in powder, ceramic, and single crystal form as well as a method for generating long persistent phosphorescence, including long persistent phosphorescence of a particular color. The invention also provides phosphorescent articles.

Persistent phosphorescence was discovered in the $11^{th}$ century in China and Japan and in the $16^{th}$ century in Europe (Shionoya, S. (1998) in *Phosphor Handbook*, Shionoya, S. and Yen, W. M. (eds.), CRC Press, Inc., Boca Raton, N.Y., p. 3). The phenomenon involves two kinds of active centers: emitters and traps. Emitters are centers capable of emitting radiation after excitation of the center. Traps do not emit radiation, but store excitation energy and release it gradually to the emitter. Emitter centers can be created through the addition of activators, i.e. small amounts of intentionally added impurity atoms or ions, to the host. Co-activators are additional intentionally added impurity ions which may affect (improve or modify) the emission of the first activator. For example, a co-activator can be added to form trapping centers which can increase the persistence time of the phosphor.

It is possible for one ion to transfer energy to another. If two different ions are involved in energy transfer, the ion transferring the energy can be called a donor or sensitizer while the ion receiving the energy can be called the acceptor or activator (G. Blasse and B. C. Grabmaier, (1994) Luminescent Materials, Springer-Verlag, Berlin, p 91). However, phosphorescent dynamics are complex and many aspects remain unclear.

Thermoluminescence and photostimulable phosphorescence are physically governed by mechanisms similar to persistent phosphorescence (Chen, R and McKeever, S. W. S. (1997), Theory of Thermoluminescence and Related Phenomena, World Scientific, Singapore; Sonoda, M. et al. (1983) Radiology 148:833). The main difference between these three phenomena appears to be the depth of traps. When a phosphor possesses centers with certain trapping depth which can be effectively thermally activated at room temperature, it will show persistent phosphorescence. Deeper trapping centers can be activated by heating or photostimulation. Measurement of the thermoluminescence of phosphor samples can be used to characterize the traps present in the phosphor. Because of the mechanistic similarities, a study of phosphorescence dynamics allows the characterization of these three important luminescence processes. Single crystal phosphors facilitate studies of phosphorescence dynamics.

Persistence of phosphorescence is measured herein as persistence time which is the time, after discontinuing irradiation, that it takes for phosphorescence of a sample to decrease to the threshold of eye sensitivity. This threshold is the signal level of emission intensity that a naked (i.e., unaided) eye can clearly see in the dark. Persistence times are assessed by following phosphorescence intensity as a function of time. Clearly measurement comparisons of persistence times must be performed under identical conditions using the same detection systems. The term "persistent phosphors" has been applied to materials exhibiting phosphorescence lasting from minutes to hours. The term "long-persistent phosphor" historically has been used to refer to ZnS:Cu, CaS:Eu, Tm and similar materials which have a persistence time of 20 to 40 minutes. In the past decade, long persistent phosphors with persistence times exceeding two or more hours have been developed. The persistence time of the materials of this invention also exceed two or more hours. As used herein, "long-persistent phosphor" refers to materials having persistence times exceeding 2 hours. It is generally the case that phosphors having longer persistence times are more preferred. The phosphor materials, including single crystals and single crystal fibers, of this invention can exhibit phosphorescence persistence times of greater than about 3–5 hrs, greater than about 10–12 hrs, or greater than about 15–18 hrs.

A phosphor may have an emission spectrum such that its phosphorescence falls largely within a particular color range. In particular, the phosphorescence may fall in the visible wavelength region. For example, if the phosphor emits primarily in the blue range, the phosphor may be called a blue phosphor. Approximate color ranges in the visual spectrum are as follows: violet or deep blue (~390–~455 nm), blue (~455–~492 nm), green (~492–~577 nm), yellow (~577–~597 nm), orange (~597–~622 nm), red (~622–~770 nm) (Academic Press Dictionary of Science and Technology, ed. C. Morris, 1992, Academic Press, San Diego, pp. 282, 958, 1527, 1814, 2334, and 2388). In one embodiment, the down converted phosphors of the invention emit in the visible range. Since longer wavelengths have lower energy, the down-converted phosphors of the invention will be shifted towards longer wavelengths.

Phosphors of this invention are based on doping of one or more emitter ions into a host matrix. The host matrix may be an alkaline earth aluminate, an alkaline earth silicate, or an alkaline earth aluminosilicate. Several basic physical factors should be considered in developing such phosphors. The host (or matrix) and emitter ion(s) are selected to provide the desired emission or phosphorescence color and high quantum efficiency. The energy of the localized ground state of the emitter should be well above the valence band of the host to allow persistent phosphorescence to occur.

The phosphors of the invention include cerium doped long-persistent phosphors. The cerium may act alone as the activator or may act as a donor in a persistent transfer phosphor. A general formula for cerium doped phosphors in which the cerium acts alone as the activator may be written as $M_vAl_xSi_yO_z:nCe^{3+}$, where M is an alkaline earth metal element such as Mg, Ca, Sr, and Ba, v>0, x≧0, y≧0, x+y>0, z>0, and n is the concentration of the cerium ion. As referred to herein, the concentration of a dopant such as cerium is measured in terms of mol % relative to the alkaline earth element, M (mol % per mole of element M). Preferred concentrations of n are greater than 0 and less than or equal to about 10%, more preferred concentrations are from about 1% to about 2%. Long persistent cerium doped aluminates ($MAl_2O_4:Ce^{3+}$) have been made which emit in the range from deep blue, blue and green.

The phosphors of the invention also include persistent energy phosphors comprising a donor system and an acceptor system. The persistent transfer phosphors of the invention are believed to behave as follows. The donor system is excitable with near ultraviolet light. The donor system and optional co activators are selected so that in the absence of the acceptor system, the phosphor comprising the donor system and the optional co-activators would emit energy to produce a long lasting afterglow or phosphorescence. The introduction of the acceptor system does not fundamentally alter the behavior of the donor system, i.e. the temporal and frequency properties of the original donor system emission remain the same. However, in the presence of the acceptor system, the optical energy stored in the donor system is transferred to the acceptor system and re-emitted at a frequency characteristic of the acceptor system. In a preferred embodiment, the light emitted by the phosphor is solely characteristic of the acceptor ion. Since the excitation stored in the donor system persists for an extended period of time, the transfer between the donor system and the acceptor system will continue over an extended period of time and the ensuing process can be described as being persistent energy transfer. As a result, the emission from the acceptor system will last for as long as the energy in the donor system persists. The acceptor system can emit at a lower or down-converted frequency or a higher or unconverted frequency compared to the donor system. However, for donor ions which emit in the blue or deep blue, down-conversion of the donor frequency allows a greater range of frequencies in the visible range.

The acceptor system comprises an acceptor ion which is incorporated into the host material through doping of the host material. The acceptor ion is an activator and is selected to provide characteristic emission at a desired emission frequency. The donor system comprises the combination of the host material and a donor ion. The donor ion is also incorporated into the host material through doping. In a given phosphor, the donor ion is different from the acceptor ion. The donor ion is an activator which is capable of emitting light after excitation of the phosphor. The phosphor may also contain one or more optional co-activator dopant ions in addition to the donor ion and acceptor ion. For example, these additional dopant ions may form trapping centers within the host. In a given phosphor, the co-activator ion is different from the acceptor and donor ions. The combination of the host material, the donor ion, and the optional co activator ion(s) is selected so that the combination is capable of forming a long persistent phosphor emitting at a first wavelength. If the first wavelength is in the visible range, the first wavelength corresponds to a first color. Furthermore, the donor ion is selected such that energy transfer can occur from the donor ion to the acceptor ion. Preferably, the afterglow of the phosphor is largely characteristic of the acceptor ion and the phosphor emits at least at a second wavelength characteristic of the acceptor ion. The second wavelength may correspond to a second color in the visible range. For example, the second color can be green, yellow, orange or red. Preferably, the first wavelength which can be emitted by the donor is different from the second wavelength emitted by the acceptor. In one embodiment, there is a visible difference between the first and the second color which can be emitted by the donor ion and acceptor ion, respectively. By largely characteristic of the acceptor ion, it is meant that most of the light emitted from the phosphor (i.e. more than about 50%) is characteristic of the acceptor ion. In the materials of the invention, the percentage of light emitted from the phosphor which is characteristic of the acceptor ion may be more than about 75% or more than about 90%. If the afterglow is solely characteristic of the acceptor ion, at least about 90% of the light emitted from the phosphor is characteristic of the acceptor ion. The amount of light emitted from the phosphor which is characteristic of the acceptor ion can be calculated from measurements of afterglow intensity at the relevant wavelengths. (e.g., through analyzing a spectrum of afterglow intensity versus wavelength). The details of such an analysis are known to those skilled in the art of spectroscopy.

The energy transfer process arises from interactions between the donor and acceptor systems and can occur radiatively or non-radiatively. In the former the light emitted by the donor ion is absorbed directly by the acceptor ion, or the energy may be transferred directly between the ion centers and no light need be emitted. Sometimes optical energy transfer processes require the absorption or emission of lattice vibrational quanta (phonons) to conserve energy. Energy transfer processes have been reviewed in depth by Morgan and Yen (Topics in Applied Physics Vol. 65, "Laser Spectroscopy in Solids II", W. M. Yen, ed., Springer-Verlag, Berlin 1989, pp. 77–119). It is preferred that the chosen acceptor ion has absorption transitions in coincidence with the energy of the emitted radiation of the donor system.

In the persistent energy transfer phosphors of the invention, the acceptor ion is selected from rare earth ions, transition metal ions, or heavy metal ions which give luminescence in the UV, visible, and IR regions when incorporated into the host material. Acceptor ions useful in the present invention include, but are not limited to, $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$. Especially useful ions are $Pr^{3+}$, $Tb^{3+}$, $Eu^{3+}$, and $Mn^{2+}$.

In the persistent energy transfer phosphors of the invention, the donor emitter ion is selected from divalent and trivalent rare earth (lanthanide) and actinide ions and ions of IVA and VA elements in low oxidation states. Useful actinide ions include uranium ions. Useful ions of IVA and VA elements in low oxidation states include $Pb^+$, and $Bi^{3+}$. Donor emitter ions useful in the present invention include, but are not limited to, $Ce^{3+}$, $Pr^{3+}$, $Sm^{3+}$, $Eu^{2+}$, $Dy^{3+}$, and $Yb^{3+}$. In a given phosphor, the donor emitter ion is selected so that it is different from the acceptor emitter ion.

In the persistent energy transfer phosphors of the invention, the co-activator ion is selected from divalent and trivalent rare earth (lanthanide), actinide, and lutetium ions, and ions of IVA and VA elements in low oxidation states. Useful actinide ions include uranium ions. Useful ions of IVA and VA elements in low oxidation states include $Pb^+$, and $Bi^{3+}$. Co-activator ions may be selected from the group: $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, and $Yb^{3+}$ and $Bi^{3+}$. Co activator ions especially useful in the present invention include, but are not limited to $Dy^{3+}$, $Tm^{3+}$, $Y^{3+}$.

In the persistent energy transfer phosphors of the invention, the host material is selected from alkaline earth aluminates, alkaline earth silicates, and alkaline earth aluminosilicates. A generalized formula for the host material can be written $M_vAl_xSi_yO_z$. In this formula, M is an alkaline earth element and v and z are greater than zero. In this formula $x \geq 0$ and $y \geq 0$ such that one of x and y is not zero (x+y>0). M may include one or more elements selected from the group consisting of Mg, Ca, Sr, and Ba.

Alkaline earth aluminates useful for the present invention include materials where y is zero, and x and z are even numbers including, but not limited to, $MAl_2O_4$ and $MAl_4O_7$.

Alkaline earth silicates useful in the present invention include materials where w is zero, including, but not limited to, $MSiO_3$. M may be a single alkaline earth element.

Alkaline earth aluminosilicates useful in the invention, include, but are not limited to $M_2Al_2SiO_7$.

As referred to herein, the concentration of a dopant such as an acceptor emitter, a donor emitter, and a co activator is measured in terms of mol % relative to the alkaline earth element, M. A general formula for the host material incorporating an acceptor ion A, a donor ion D, and a co activator C can be written $M_vAl_xSi_yO_z$:dD, cC, aA. In this formula, a is the concentration of dopant A, c is the concentration of co activator C and d is the concentration of dopant D. Values of a and d are greater than zero and range up to about 10%. Preferred values of a and d are between about 0.5% and about 2%. Since a co activator is optional, values of c range from zero to about 10%. Preferred values of c range from about 0 to about 5%. The concentration of D and A ions determines the rate at which the transfer of optical energy occurs in the new phosphors. The appropriate concentration can be optimized by increasing the A concentration until the original D phosphorescence is reduced completely or to a specified minimum. Standard methods of chemical analysis can be used to measure the amounts of activator, co-activator, and dopant.

Useful materials for the invention include, but are not limited to $MAl_2O_4$:$dCe^{3+}$, $aTb^{3+}$; $MAl_2O_4$:$dCe^{3+}$, $aMn^{3+}$;

$MAl_2O_4$:$dEu^{2+}$, $aMn^{3+}$; $M_2Al_2SiO_7$:$dCe^{2+}$, $aMn^{2+}$; and $MSiO_3$:$dEu^{2+}$, $aMn^{2+}$, $cDy^{3+}$. M, d, a, and c are as defined above. M is preferably Mg, Ca, Sr, or Ba. Preferred values of a and d are between about 0.5% and about 2%, while preferred values of c are between 0 and about 5%.

The phosphorescence of the persistent energy transfer phosphor of the invention is independent of the phosphor being immersed into a matrix which does not substantially react with the phosphor (e.g. enamels, waxes, varnishes, paints, and polymers). Therefore, the persistent energy transfer phosphors of the invention can be used in the manufacture of phosphorescent articles which incorporate the phosphors into a suitable matrix.

The invention also provides a method for generating long persistent phosphorescence at a selected color. The method comprises the steps of: selecting at least a first activator capable of producing long persistent phosphorescence of a first color when incorporated with optional co-activators into a host; selecting at least a second activator capable of producing long persistent phosphorescence of the selected color when incorporated into the host with the first activator and the optional co-activators, the second activator being capable of accepting optical energy from the first activator; fabricating a long-persistent phosphor comprising the second activator, the first activator and optional co-activators incorporated into the host; and irradiating the long-persistent phosphor, thereby producing long-persistent phosphorescence of the selected color, wherein the first activator, the second activator, and the optional co-activators are all different ions and the first color is different from the selected color. Therefore, the invention allows modification of the color emitted by a known long-persistent phosphor by adding an additional activator which emits at the desired color and which can act as an acceptor. The invention also allows modification of the persistence length of a known non-persistent phosphor by adding an additional activator which is capable of producing long-persistent phosphorescence in the host and which is capable of acting as a donor.

The invention also provides a method for making a long-persistent phosphor comprising the steps of (a) combining at least one source material for a host, at least one source material for a donor ion, at least one source material for an acceptor ion, and, optionally, at least one source material for a co activator; and (b) sintering the combined source materials in a reducing atmosphere. As used herein, a source material is equivalent to a phosphor component.

In general, powders of the phosphors of the invention are obtained by sintering mixtures of chemicals approximately according to the stoichiometry of the phosphor formula at the proper temperatures and under the proper atmospheric conditions. However, in some cases a slight (approximately 1–3%) excess of a particular component may be desired for better quality of the phosphor. For example, an excess of CaO may improve the quality of calcium containing phosphors.

The approximate formula for a long-persistent phosphor activated by cerium alone is:

$$M_vAl_xSi_yO_z:nCe^{3+} \quad (I)$$

or

$$vMO.(x/2)Al_2O_3.y(SiO_2):nCe^{3+} \quad (II)$$

wherein M is an alkaline earth metal v>0, x 0,y 0, x+y>0,z>0, and n is between about 0.1% and 5%.

As another example, an approximate formula for a long-persistent energy transfer phosphor incorporating a donor (D), an optional co-activator (C) and an activator (A) is:

$$M_vAl_xSi_yO_z:dD, cC, aA \quad (III)$$

or

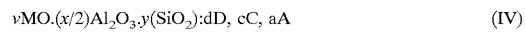

$$vMO.(x/2)Al_2O_3.y(SiO_2):dD, cC, aA \quad (IV)$$

wherein M is an alkaline earth metal, D is a donor ion, A is an acceptor ion, C is a co-activator ion, v>0, x≧0, y≧0, x+y>0, z>0.0<d≦10%, and 0<a≦10%, and 0≦c≦10%.

For the above formulas, useful sources of the host material can include, but are not limited to alkaline earth metal carbonates, alumina, and silica. Useful sources of the acceptor ion A, donor ion D, and co activator ion C are oxides and carbonates capable of providing the relevant ion. Additional useful sources of the host material, acceptor ion, donor ion, and co activator ion would be readily apparent to those skilled in the art.

When the phosphor is not to be made in single crystal form, the mixture of chemicals preferably also contains a flux. The flux is important to the formation of the fluorescent phase. The flux is used to improve the solid state chemical reaction. Suitable fluxes include $B_2O_3$ and $H_3BO_3$ and their commercially available hydrates. Useful amounts of $B_2O_3$ are in the range of about 0.02% to about 8%, with the range about 1 to about 5% being preferred. $B_2O_3$ can be replaced in all formulations of this invention by an amount of $H_3BO_3$ sufficient to provide an equivalent molar amount of B (e.g., $2H_3BO_3$ replace each $B_2O_3$). The flux may or may not be removed after sintering is complete. The flux may be removed by methods known in the art (e.g., washing with hot water).

In one method of preparing powders, the proper admixture of raw materials is ground and mixed. Typical purity levels of the raw materials are 99.9% or greater, but raw materials of lesser purity may be used so long as the luminescence is not significantly decreased. For example, it is desirable to limit the amount of impurities which can quench the luminescence. Mixing may be achieved by any means known to those skilled in the art, including mixing by hand or with a ball mill. The mixing step may last 2 or more hours. The powder is then sintered. The sintering may take place between about 800° C. and about 1000° C. in an oxidizing environment such as air or in a reducing environment. The resulting material from the first sintering is then ground and mixed again for uniformity. Again, the mixing step may last 2 or more hours. The resulting powder is sintered for a second time in a reducing atmosphere. One suitable reducing atmosphere is a gas flow of $N_2$ containing 2–5% by volume $H_2$ at a flow rate of 0.1 liter per minute. For this second sintering step, suitable sintering temperatures and times are approximately 1350° C. for approximately 5 hours for aluminates and approximately 1200° C. for approximately 5 hours for silicates and aluminosilicates.

Ceramic bodies such as pellets may be obtained by compressing the ceramic powders into a body before the second sintering step. The compression may be performed using a hydraulic high pressure device. A pressure of 1.3 ton/cm² is sufficient.

Single crystals of the phosphors of this invention can be grown directly from a melt by well-known techniques. For example, the conventional Czochralski method (J. Czochralski (1918) Z. Phys. Chem. 92:219), the floating zone method (W. G. Pfann (1952) Trans. AIME 194:747) or the laser heated pedestal method (B. M. Tissue et al. (1991) J. Crystal Growth 109:323) can be used. The following procedure employs the laser heated pedestal (LHPG) method.

The following procedure is for aluminate phosphors. In general, aluminosilicates and silicates are more difficult to grow in single crystal form because they can undergo a number of phase transitions below their melting temperature. These transitions can result in severe cracking of the crystals once they leave the growth region.

The phosphor components are mixed in the appropriate molar proportions and the mixtures are milled or ground to give a homogeneous fine powder. The powder is pressed into pellets under about 1.3 ton/cm² pressure. One convenient pellet size is 1.5 mm thick by 15 mm diameter. The pressed pellets are then prefired in air at about 900 EC for about two hours. The prefired pellets are pulverized and milled again into a fine powder. The prefired powder is pressed again into ceramic pellets at the same pressure. The pellets are then sintered at about 1,350 EC (aluminates) or about 1200 EC for about 5 hours (silicates and aluminosilicates) in a flowing $H_2$—$N_2$ gas mixture (2%–5% by volume $H_2$) with a flow rate of about 0.1 liter/min.

The sintered pellets are cut into rods with cross-sections of about 1×1 mm. The bars are carefully cleaned with solvents (such as alcohol or acetone) before introduction into the growth chamber. The growth chamber is filled with a neutral gas mixture ($N_2$ with <1% $H_2$, e.g., 99.99% $N_2$). Care must be taken to prevent re-oxidation of any europium ions from the 2+ state to the 3+ state and to prevent oxidation of any trivalent ions such as cerium, terbium, manganese etc. from the 3+ state to the 4+ state, and to prevent reduction to the monovalent state of metal at the melting temperature. A pointed ceramic bar can be used as a "seed" to stimulate spontaneous nucleation in the LHPG process. The initial part of the fiber prepared by the LHGP process can be a twinned crystal. The fiber eventually becomes one single crystal after a transition stage, but the crystal is not oriented. As used herein, "single-crystal" encompasses this morphology. Fiber lengths of single crystals grown are variable, but can be as long as several centimeters in length. Single crystals with an average diameter of about 0.8 mm can be grown.

Single crystal growth proceeds substantially as described in Yen et al. (1995) "Preparation of single crystal fibers," in *Insulating Materials for Optoelectronics*, ed. Agullo-Lopez (World Scientific, Singapore) Chapter 2.

Those of ordinary skill in the art will appreciate that the phosphors of this invention can be prepared using starting materials other than those specifically disclosed herein and that procedures and techniques functionally equivalent to those described herein can be employed to make and assess the phosphors herein. Those of ordinary skill in the art will also appreciate that the host matrix of this invention may accommodate metal ions other than those specifically mentioned herein without significant effect upon phosphor properties.

All references cited herein are incorporated by reference herein to the extent that they are not inconsistent herewith.

EXAMPLES

Example 1

Preparation of Single Crystal $CaAl_2O_4$:$Ce^{3+}$

The phosphor components were combined in the following proportions:

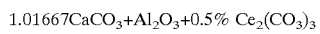

The purity of the starting materials was 99.95% for alkaline earth oxides and other compounds, 99.95% for aluminum oxide, and 99.9% for rare earth oxides and other compounds.

The mole ratio of calcium, aluminum, oxygen and cerium in the compound is

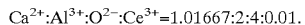

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1350° C. for 5 hours in air. The sintered pellets were then cut into 1×1 mm² rods with sharp tips at one end to serve as feeds and seeds. The single crystal fibers were pulled using the LHPG method with 1 mm/min seed speed and 0.3 mm/min feed speed in a chamber with 5% $H_2$+$N_2$ gas to prevent oxidation of $Ce^{3+}$ to $Ce^{4+}$. Fibers may also be grown in air, followed by annealing the samples in a reducing atmosphere to recover the desired state of the dopant ions. Suitable annealing conditions are 1200–1300 EC in 5% $H_2$+95% $N_2$ gas flow for two hours.

Figure 2:
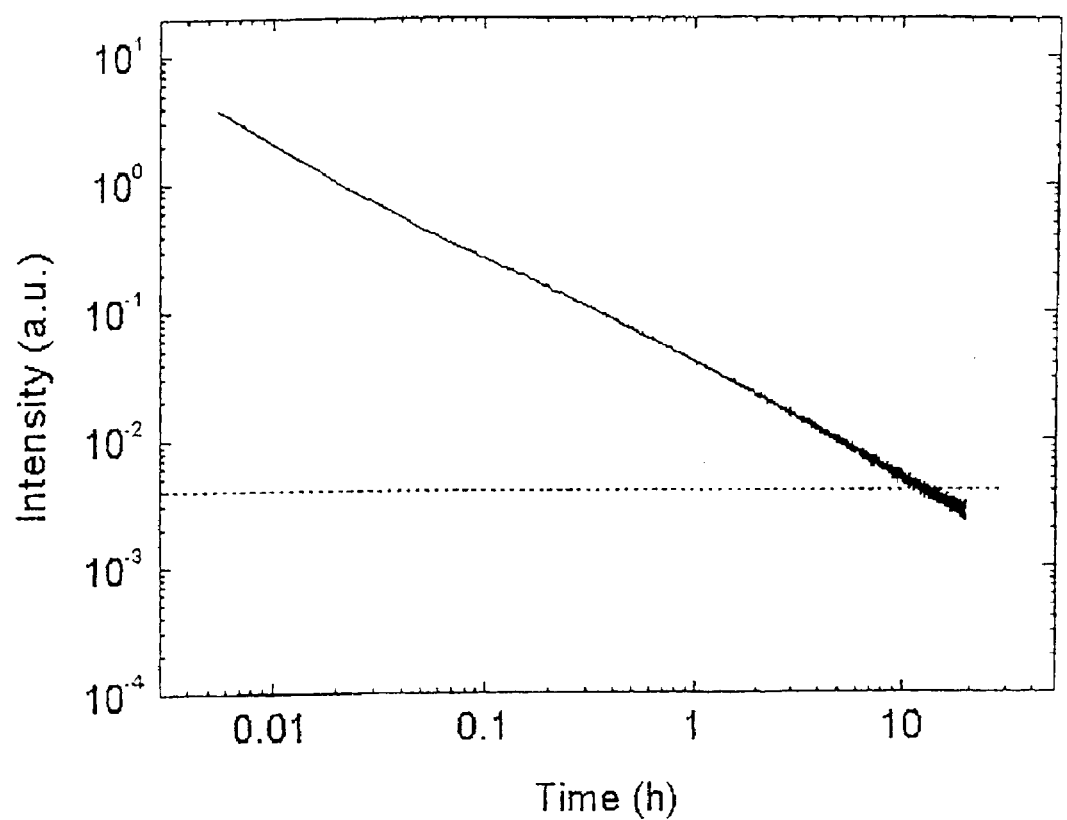
FIG. 2 shows the afterglow decay curve for single crystal $CaAl_2O_4 : Ce^{3+}$.

FIG. 1 shows the afterglow spectrum for this material. The afterglow curve peaks at 413 nm (deep blue). FIG. 2 shows the afterglow decay curve for this material, the decay was monitored at 418 nm. The limit of normal human eye sensitivity is shown by the dashed line. The persistence time is therefore approximately 10 hours.

Further discussion of fabrication of this material is provided in Jia et al. (2002) (Applied Physics Letters, 80(9), 1535–1537.)

Example 2

Preparation of $SrAl_2O_4$:$Ce^{3+}$

The phosphor components were combined in the following proportions.

The purity of the starting materials was 99.95% for alkaline earth oxides and other compounds, 99.95% for aluminum oxide, and 99.9% for rare earth oxides and other compounds, and 99.9% for boron oxide or boric acid.

The mole ratio of strontium, aluminum, oxygen and cerium in the compound is:

$Sr^{2+}$:$Al^{3+}$:$O^{2-}$:$Ce^{3+}$=1:2:4:0.01.

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1350° C. for 5 hours in 5% $H_2$+$N_2$ gas flow to prevent oxidation of $Ce^{3+}$ to $Ce^{4+}$.

Figure 3:
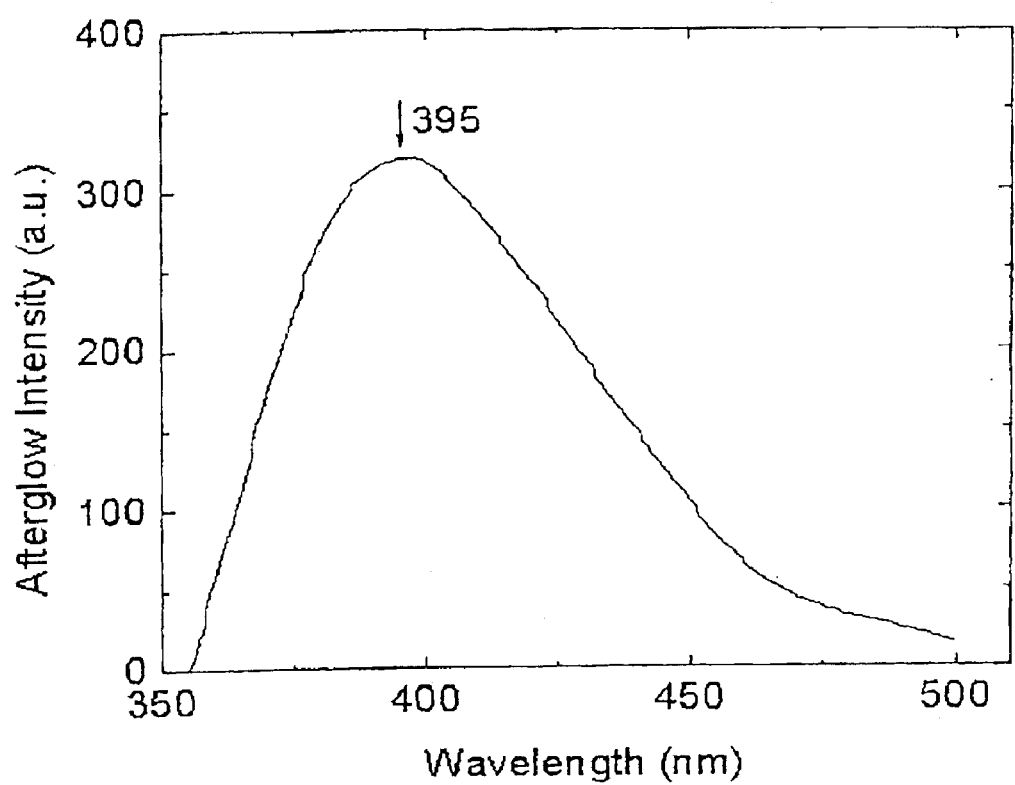
FIG. 3 shows the afterglow spectrum for $SrAl_2O_4 : Ce^{3+}$, which peaks at about 395 mm (deep blue).
Figure 4:
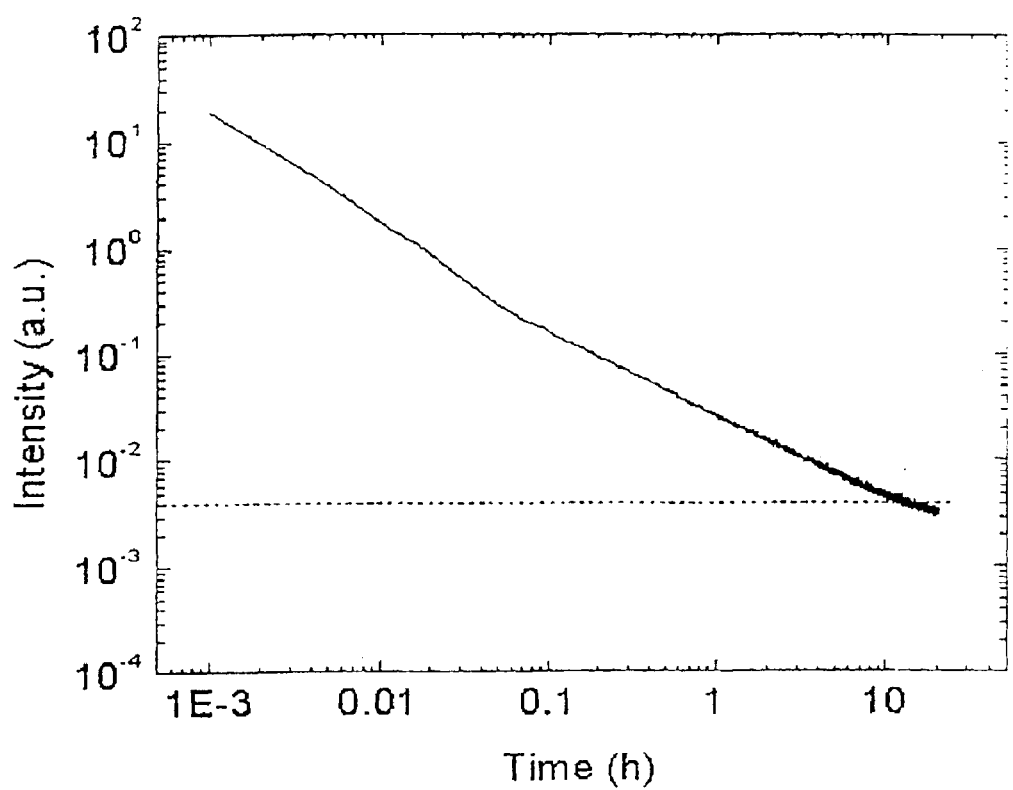
FIG. 4 shows the afterglow decay curve for $SrAl_2O_4 : Ce^{3+}$.

FIG. 3 shows the afterglow spectrum for this material. The afterglow curve peaks at 395 nm (deep blue). FIG. 4 shows the afterglow decay curve for this material, the decay was monitored at 395 nm. The limit of normal human eye sensitivity is shown by the dashed line. The persistence time is therefore approximately 10 hours.

Example 3

Preparation of Single Crystal $CaAl_2O_4$:$Ce^{3+}$, $Tb^{3+}$

The phosphor components were combined in the following proportions:

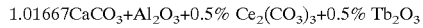

The purity of the starting materials was 99.95% for alkaline earth oxides and other compounds, 99.95% for aluminum oxide, and 99.9% for rare earth oxides and other compounds.

The mole ratio of calcium, aluminum, oxygen, cerium, and terbium in the compound is $Ca^{2+}:Al^{3+}:^{2-}:Ce^{3+}:Tb^{3+} = 1.01667:2:4:0.01:0.01$.

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1350° C. for 5 hours in air. The sintered pellets were then cut into 1×1 mm² rods with sharp tips at one end to serve as feeds and seeds. The single crystal fibers were pulled using the LHPG method with 1 mm/min seed speed and 0.3 mm/min feed speed in a chamber with 5% $H_2+N_2$ gas to prevent oxidation of $Ce^{3+}$ to $Ce^{4+}$ and $Tb^{3+}$ to $Tb^{4+}$. Fibers may also be grown in air, followed by annealing the samples in a reducing atmosphere to recover the desired state of the dopant ions. Suitable annealing conditions are 1200–1300 EC in 5% $H_2$+95% $N_2$ gas flow for two hours.

Figure 5:
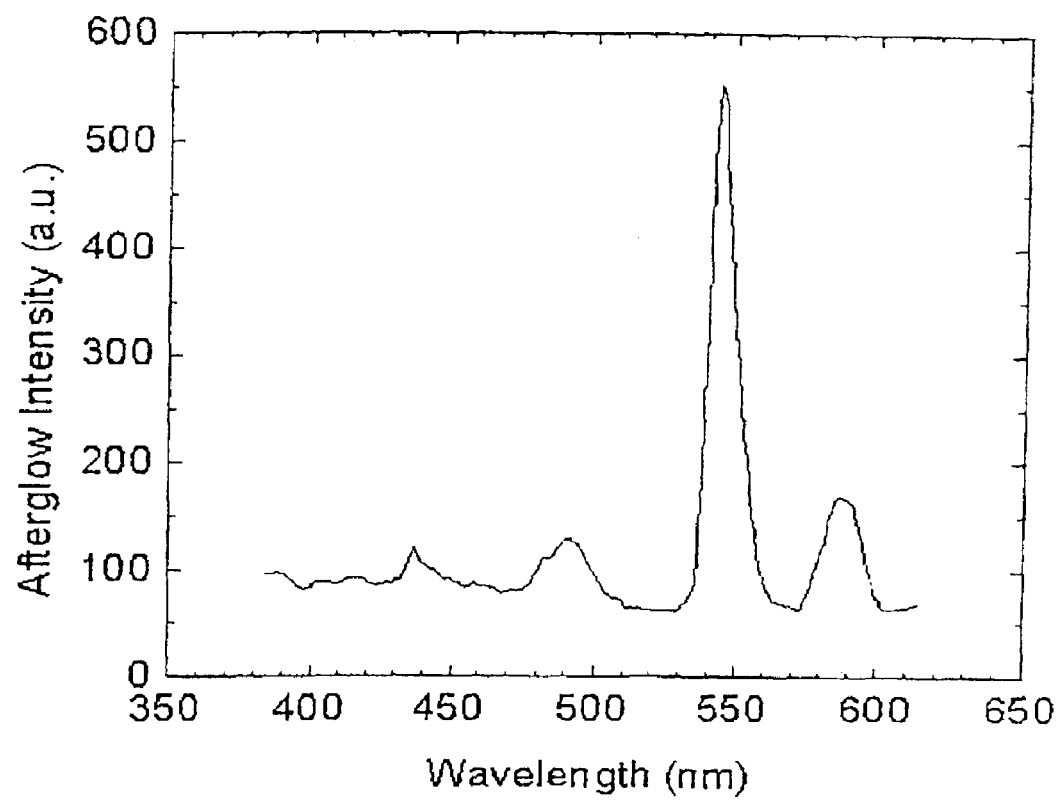
FIG. 5 shows the afterglow spectrum for single crystal $CaAl_2O_4 : Ce^{3+}, Tb^{3+}$, which peaks at about 550 nm (green).

FIG. 5 shows the afterglow spectrum for this material. The afterglow curve peaked at approximately 550 nm (green). The $Ce^{3+}$ donor transition is a 4f-5d transition (5d to $F_{5/2}$, 413 nm) with a lifetime of 13.5 ns. The $Tb^{3+}$ acceptor transition is a 4f-4f transition ($^5D_4$ to $^4F_5$, 543 nm) with a lifetime of 2.21 ms. The energy transfer rate was estimated at $10^8 s^{-1}$ at 0.1% of both donor and acceptor doping concentrations and $10^{9-10} s^{-1}$ at 1 at % doping concentrations of both donor and acceptor. As shown in FIG. 5, $Ce^{3+}$ emission disappeared in the 1 at % concentration sample and $Tb^{3+}$ green emission dominated. This indicated that 1% was a useful concentration for D and A.

Figure 6:
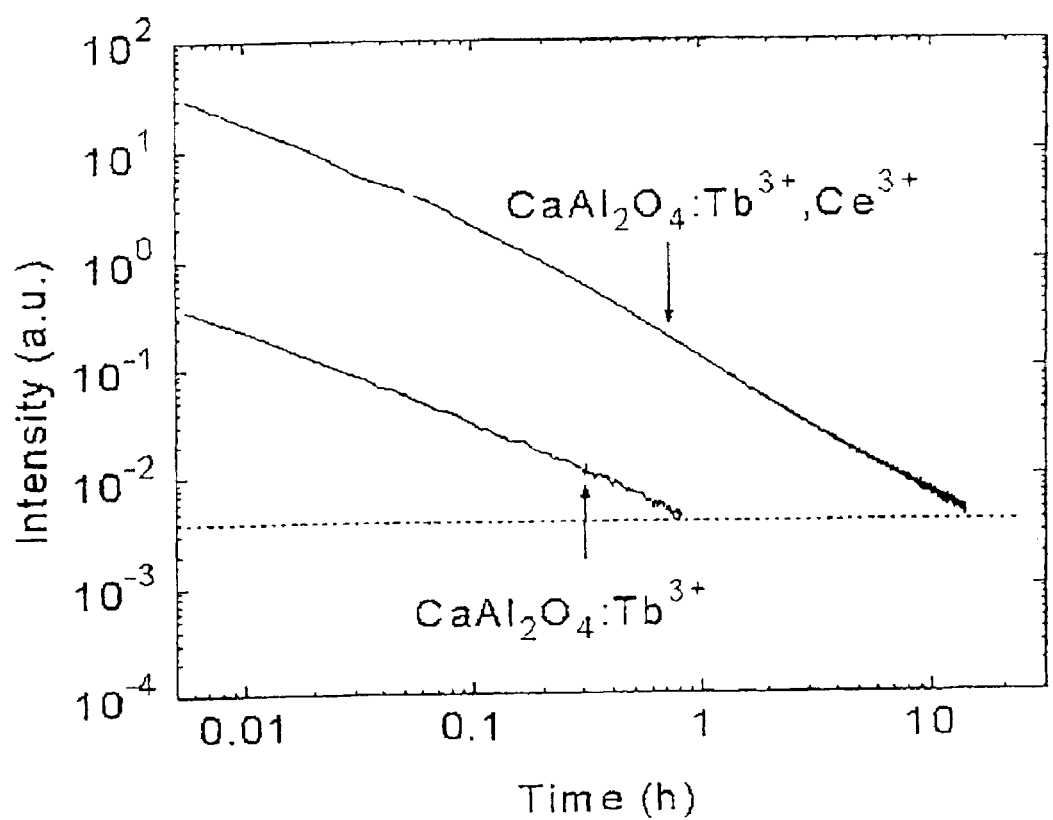
FIG. 6 shows the afterglow decay curve for single crystal $CaAl_2O_4 : Ce^{3+}, Tb^{3+}$.

FIG. 6 shows the afterglow decay curve for this material, the decay was monitored at approximately 550 nm. FIG. 6 also shows the afterglow decay curve for $CaAl_2O_4:Tb^{3+}$. The limit of normal human eye sensitivity is shown by the dashed line. The persistence time of the afterglow has been prolonged from approximately 1 hour to approximately 10 hours by incorporation of $Ce^{3+}$ into $CaAl_2O_4:Tb^{3+}$. The latter time is on the order of the persistence time of $CaAl_2O_4:Ce^{3+}$.

Further discussion of this material is provided in Jia et al. (2003) (J. Appl. Phys. 93, 148–152) and Jia et al. (2002) (Applied Physics Letters, 80(9), 1535–1537).

Example 4

Preparation of $CaAl_2O_4:Ce^{3+}$, $Mn^{2+}$

The phosphor components were combined in the following proportions:

$1.01667CaCO_3+Al_2O_3+0.5\% Ce_2(CO_3)_3+0.5\% MnO+1\% B_2O_3(flux)$

The purity of the starting materials was 99.95% for alkaline earth oxides and other compounds, 99.95% for aluminum oxide, 99.9% for rare earth oxides and other compounds, 99.9% for MnO, and 99.9% for boron oxide or boric acid.

The mole ratio of calcium, aluminum, oxygen, cerium, and manganese in the compound is:

$Ca^{2+}:Al^{3+}:O^{2-}:Ce^{3+}:Mn^{2+} = 1.01667:2:4:0.01:0.005$.

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1350° C. for 5 hours in 5% $H_2+N_2$ gas flow to prevent oxidation of $Ce^{3+}$ to $Ce^{4+}$ and $Mn^{2+}$ to $Mn^{3+}$.

Figure 7:
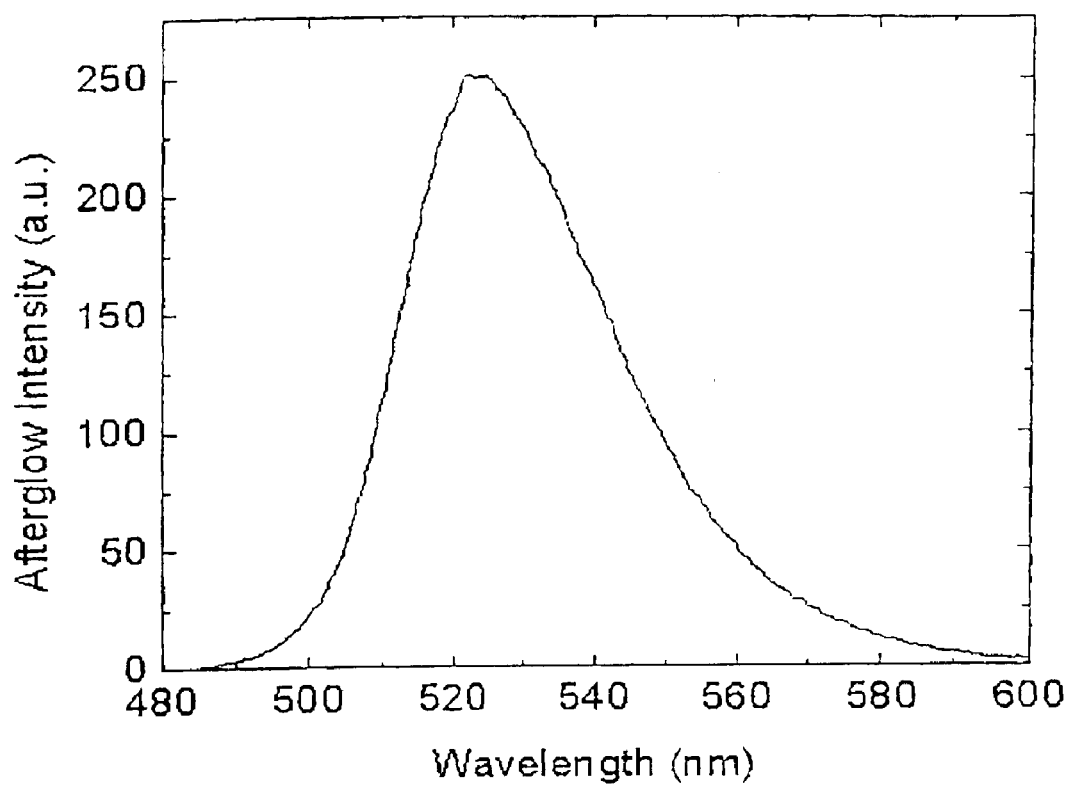
FIG. 7 shows the afterglow spectrum for $CaAl_2O_4 : Ce^{3+}, Mn^{2+}$, which peaks at about 525 nm (green).

FIG. 7 shows the afterglow spectrum for this material. The afterglow curve peaks at 525 nm (green) and is characteristic of $Mn^{2+}$ rather than $Ce^{3+}$ emission.

Figure 8:
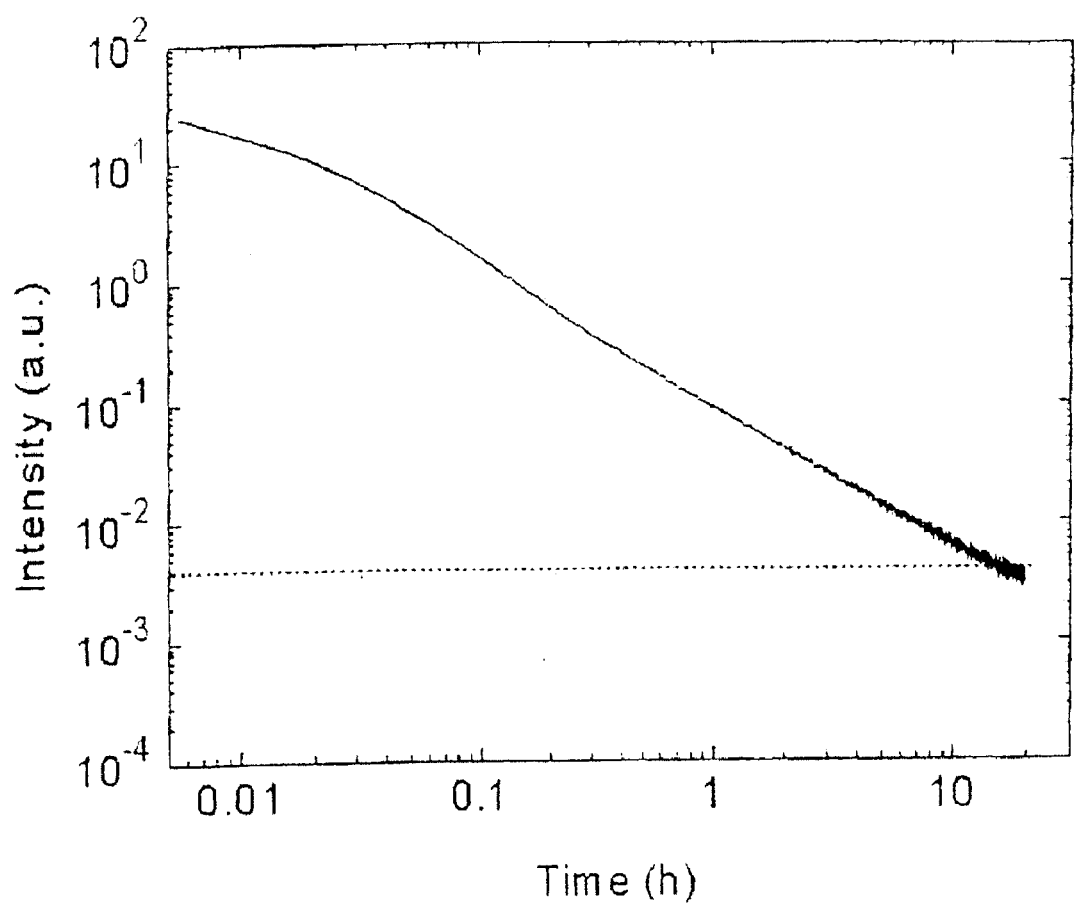
FIG. 8 shows the afterglow decay curve for $CaAl_2O_4 : Ce\_^{3+}, Mn^{2+}$.

FIG. 8 shows the afterglow decay curve for this material, the decay was monitored at 525 nm. The limit of normal human eye sensitivity is shown by the dashed line. The persistence time is therefore approximately 10 hours.

Example 5

Preparation of Ceramic Pellets of $Ca_2Al_2SiO_7:Ce^{3+}$, $Mn^{2+}$ $2.01667CaCO_3+Al_2O_3+SiO_2+0.5\% Ce_2(CO_3)_3+0.5\% MnO+1\% B_2O_3(flux)$ The purity of the starting materials was 99.95% for alkaline earth oxides and other compounds, 99.95% for aluminum oxide and silicon oxide, and 99.9% for rare earth oxides and other compounds, 99.9% for MnO, and 99.9% for boron oxide or boric acid.

The mole ratio of calcium, aluminum, silicon, oxygen, cerium, and manganese in the compound is:

$Ca^{2+}:Al^{3+}:Si^{4+}:O^{2-}:Ce^{3+}Mn^{2+} = 2.01667:2:1:7:0.01:0.05$.

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1200° C. for 5 hours in 5% $H_2+N_2$ gas flow to prevent oxidation of $Ce^{3+}$ to $Ce^{4+}$ and $Mn^{2+}$ to $Mn^{3+}$.

Figure 9:
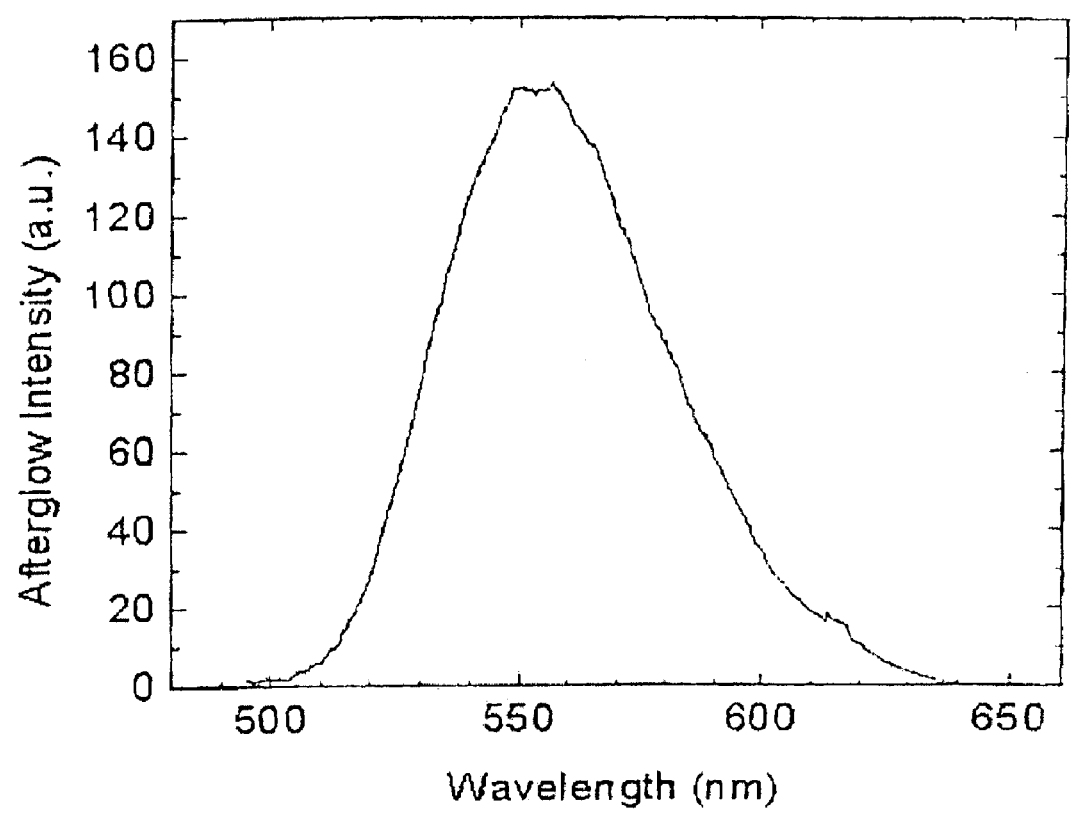
FIG. 9 shows the afterglow spectrum for $CaAl_2O_4 : Ce^{3+}, Mn^{2+}$, which peaks at about 560 nm (greenish-yellow).
Figure 10:
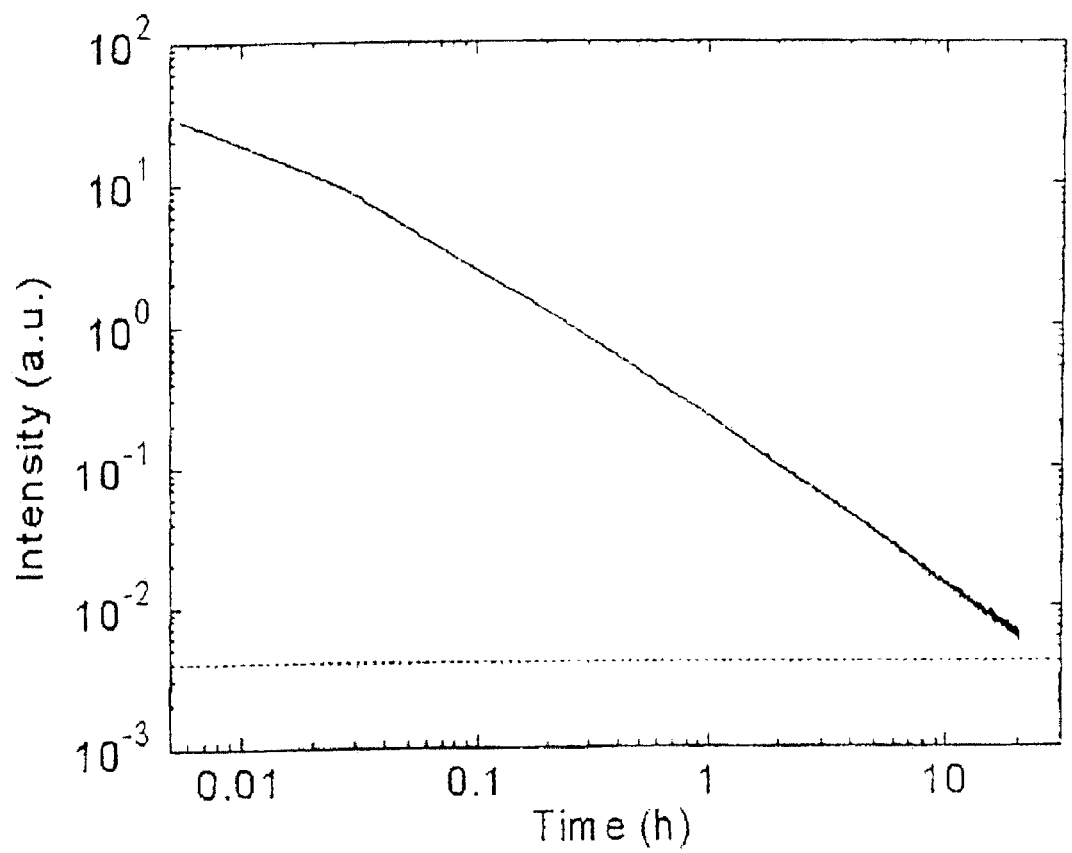
FIG. 10 shows the afterglow decay curve for $Ca_2Al_2SiO_7 : Ce^{3+}, Mn^{2+}$.

FIG. 9 shows the afterglow spectrum for this material. The afterglow curve peaks at 560 nm (greenish-yellow or canary yellow) and is characteristic of $Mn^{2+}$ emission. FIG. 10 shows the afterglow decay curve for this material, the decay was monitored at 560 nm. The limit of normal human eye sensitivity is shown by the dashed line. The persistence time is therefore greater than about 10 hours.

Example 6

Preparation of Ceramic Pellets of $MgSiO_3:Eu^{2+}$, $Dy^{3+}$, $Mn^{2+}$

The phosphor components were combined in the following proportions:

$MgO+SiO_2+0.5\% Eu_2O_3+1\% Dy_2O_3+0.5\% MnO+1\% B_2O_3(flux)$

The purity of the starting materials was 99.95% for alkaline earth oxides, 99.95% for silicon oxide, 99.9% for rare earth oxides and other compounds, 99.9% for MnO, and 99.9% for boron oxide or boric acid.

The mole ratio of calcium, silicon, oxygen, europium, dysprosium and manganese in the compound is:

$Mg^{2+}:Si^{4+}:O^{2-}:Eu^{2+}:Dy^{3+}:Mn^{2+} = 1.01667:2:4:0.01:0.05$.

The mixture of the raw materials was pressed into pellets with 1.5 mm thickness and 15 mm diameter. The pellets were first sintered at 900° C. for 2 hours in air. The sintered mixture was ground, mixed, and pressed into pellets again. The pellets were then sintered at 1200° C. for 5 hours in 5% $H_2+N_2$ gas flow to prevent oxidation of $Eu^{2+}$ to $Eu^{3+}$, $Dy^{3+}$ to $Dy^{4+}$ and $Mn^{2+}$ to $Mn^{3+}$.

Figure 11:
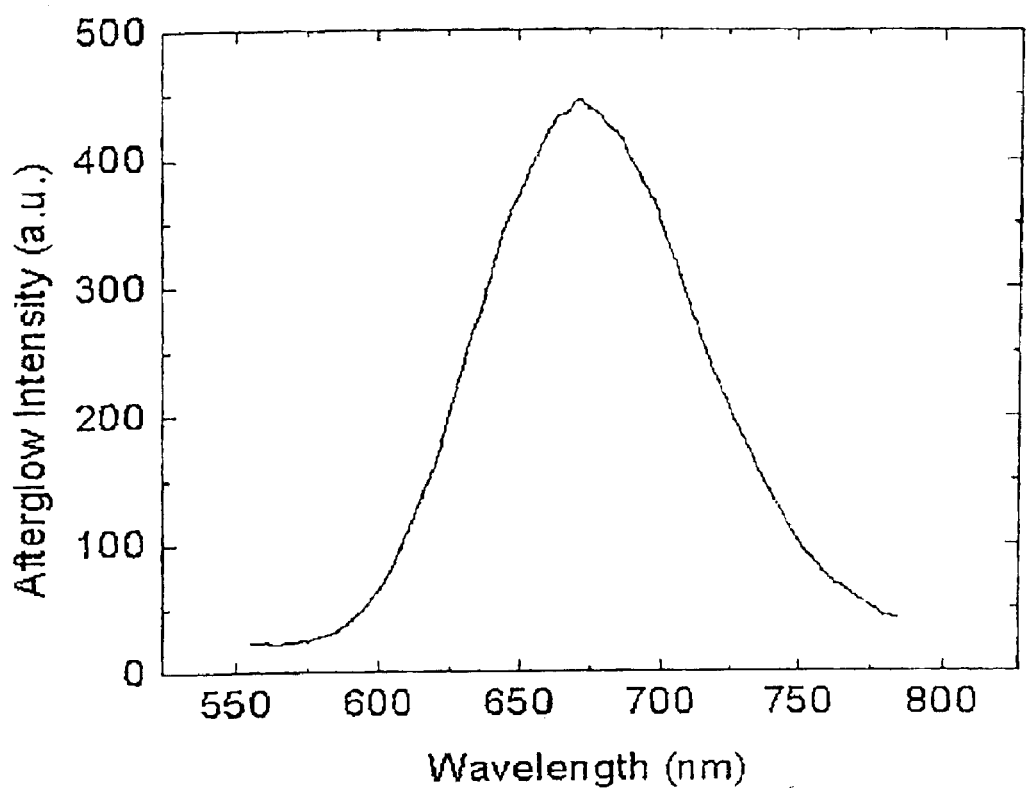
FIG. 11 shows the afterglow spectrum for $MgSiO_3 : Eu^{2+}, Dy^{3+}, Mn^{2+}$, which peaks at about 660 nm (red).
Figure 12:
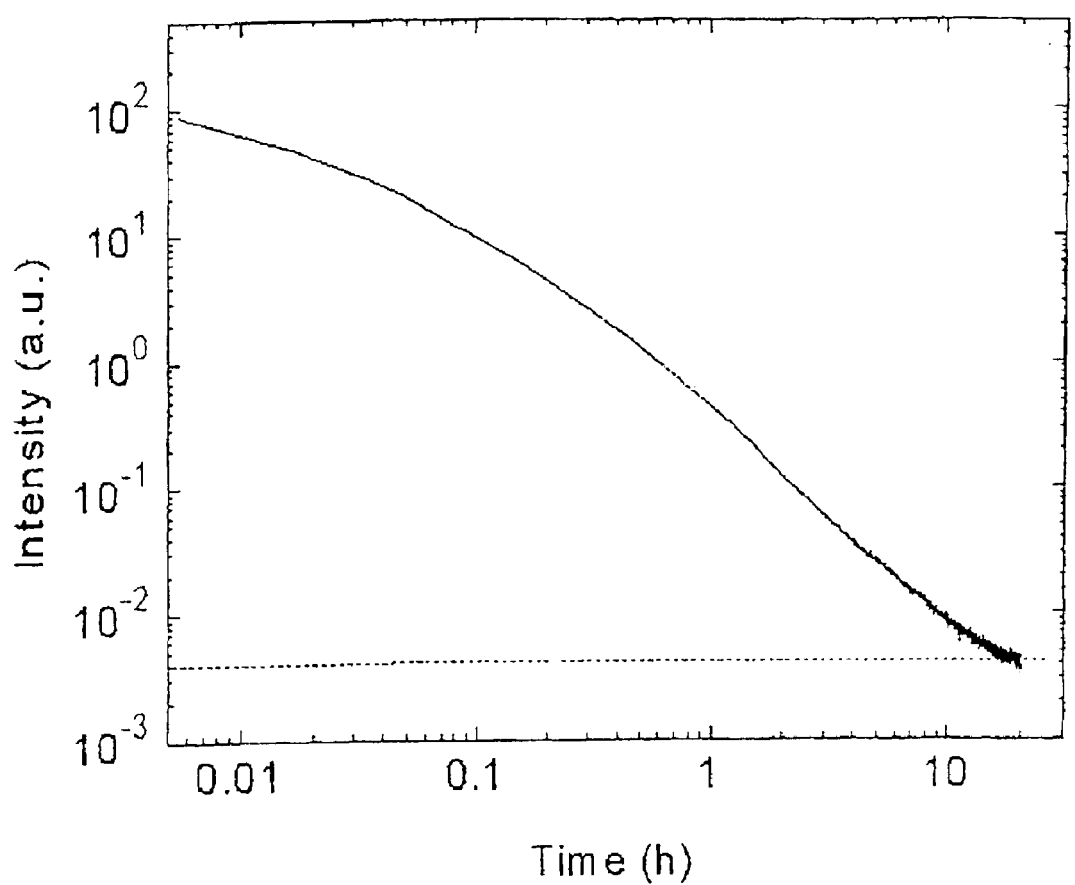
FIG. 12 shows the afterglow decay curve for $MgSiO_3 : Eu^{2+}, Dy^{3+}, Mn^{2+}$.

FIG. 11 shows the afterglow spectrum for this material. The afterglow curve peaks at 660 nm (red) and is characteristic of $Mn^{2+}$ emission in this compound. FIG. 12 shows the afterglow decay curve for this material, the decay was monitored at 660 nm. The limit of normal human eye sensitivity is shown by the dashed line. The persistence time is therefore approximately 10 hours.

Example 7

Preparation of a Phosphorescent Article

A selected amount of a phosphor of the invention is mixed with a matrix. The matrix does not substantially react with the phosphor or interfere with the long persistent phosphorescence of the phosphor. Suitable matrices include, but are not limited to enamels, waxes, varnishes, paints, and polymers.

The relative amount of the phosphor depends on the particular application. Most generally, the amount of phosphor ranges from 0.01% to 99.99%. In various embodiments, the relative amount is phosphor is from about 0.1% to about 25%, from about 0.1% to about 15%, from about 0.1% to about 10%, and from about 0.1% to about 5%.

The matrix material containing the phosphor is processed into an article by any known shaping or fabrication method which is not dependent on extreme heating (temperatures greater than half the sintering temperature) or use of strong acids or bases.

We claim:

1. A method for generating long persistent phosphorescence at a selected color comprising the steps of:
    a) selecting at least a first activator capable of producing long persistent phosphorescence of a first color when incorporated with a co-activator into a host;
    b) selecting at least a second activator capable of producing long persistent phosphorescence of the selected color when incorporated into the host with the first activator and the co-activator, the second activator being capable of accepting energy from the first activator;
    c) fabricating a long-persistent phosphor comprising the second activator, the first activator and the co activator incorporated into the host; and
    d) irradiating the long-persistent phosphor, thereby producing long-persistent phosphorescence of the selected color,
    wherein the first activator, the second activator, and the co-activator are all different ions and the first color is different from the selected color and the host is an alkaline-earth aluminate or an alkaline-earth aluminosilicate.

2. The method of claim 1 wherein the second color is green, yellow, orange or red.

3. The method of claim 1 wherein the second activator is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$.

4. The method of claim 1 wherein the first activator is selected from the group consisting of $Ce^{3+}$, $Pr^{3+}$, $Sm^{3+}$, $Eu^{2+}$, $Dy^{3+}$, and $Yb^{3+}$.

5. A method for making a long persistent phosphor comprising the steps of:
    a) combining the phosphor components according to the stoichiometry of the formula:

$v(MO).(x/2)(Al_2O_3).y(SiO_2):dD, cC, aA$ where M is an alkaline-earth metal, D is a donor ion, C is a co activator ion, A is an acceptor ion, $v>0$, $x \geq 0$, $y \geq 0$, $x+y>0$, $0<d \leq 10\%$, $0<c \leq 10\%$ and $0<a \leq 10\%$; and b) sintering the phosphor components; and
    c) growing a single crystal from the sintered phosphor components, whereby the phosphor is a single crystal phosphor.

6. The method of claim 5 wherein a flux is combined with the phosphor components in step (a).

7. The method of claim 5 wherein the flux is $B_2O_3$, $H_3BO_3$, or hydrates thereof.

8. The method of claim 5 wherein D is selected from the group consisting of $Ce^{3+}$, $Pr^{3+}$, $Sm^{3+}$, $Eu^{2+}$, $Dy^{3+}$, and $Yb^{3+}$ and A is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$.

9. A method for making a long persistent phosphor comprising the steps of:
    a) combining the phosphor components according to the stoichiometry of the formula:

$v(MO).(x/2)(Al_2O_3).y(SiO_2):dD, cC, aA$ where M is an alkaline-earth metal, D is a donor ion, C is a co activator ion, A is an acceptor ion, $v>0$, $x \geq 0$, $y \geq 0$, $x+y>0$, $0<d \leq 10\%$, $0<c \leq 10\%$ and $0<a \leq 10\%$;
    b) sintering the phosphor components; and
    c) grinding the sintered phosphor components and re-sintering the ground phosphor components in a reducing or oxidizing atmosphere.

10. A method for making a long persistent phosphor comprising the steps of:
    a) combining the phosphor components according to the stoichiometry of the formula:

$v(MO).(x/2)(Al_2O_3).y(SiO_2):dD, cC, aA$ where M is an alkaline-earth metal, D is a donor ion, C is a co activator ion, A is an acceptor ion, $x+y>0$, $0<d \leq 10\%$, $0<c \leq 10\%$ and $0<a \leq 10\%$; and
    b) sintering the phosphor components, wherein v is 1, x is 2, and y is 0, or wherein v is 2, x is 2, and y is 1.

11. A long persistent phosphor comprising an alkaline-earth metal aluminate or an alkaline-earth metal aluminosilicate host, a donor ion, a co-activator, and an acceptor ion, wherein the donor ion is capable of transfer of optical energy to the acceptor ion, the phosphor emits light largely characteristic of the acceptor ion and the first activator, the second activator, and the co-activator are all different ions.

12. The phosphor of claim 11 wherein the donor ion is selected from the group consisting of $Ce^{3+}$, $Pr^{3+}$, $Sm^{3+}$, $Eu^{2+}$, $Dy^{3+}$, and $Yb^{3+}$.

13. The phosphor of claim 11 wherein the acceptor ion is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$.

14. A long persistent phosphor represented by the formula:

$M_vAl_xSi_yO_z: dD, cC, aA$ wherein M is an alkaline earth metal, D is a donor ion, A is an acceptor ion, C is a co activator ion $v>0$, $x>0$, $y \geq 0$, $x+y>0$, $z>0$, $0<d \leq 10\%$, $0<c \leq 10\%$ and $0<a \leq 10\%$ and the phosphor emits light largely characteristic of the acceptor ion.

15. The phosphor of claim 14, wherein M is selected from the group consisting of Mg, Ca, Sr, and Ba.

16. The phosphor of claim 14, wherein $0.5\%<d \leq 2\%$, and $0.5<a \leq 2\%$ and $0<c \leq 5\%$.

17. The phosphor of claim 14 wherein the phosphor is a powder, a ceramic body or a single crystal.

18. The phosphor of claim 14 wherein v is 1, x is 2, y is 0, and z is 4.

19. The phosphor of claim 18 wherein D is selected from the group consisting of $Ce^{3+}$, $Pr^{3+}$, $Sm^{3+}$, $Eu^{2+}$, $Dy^{3+}$, and $Yb^{3+}$ and A is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^+$, $Mn^{2+}$, $Ni^{2+}$, $Pb^+$, and $Bi^{3+}$.

20. The phosphor of claim 14 wherein v is 2, x is 2, y is 1, and z is 7.

21. The phosphor of claim 20 wherein D is selected from the group consisting of $Ce^{3+}$, $Pr^{3+}$, $Sm^{3+}$, $Eu^{2+}$, $Dy^{3+}$, and $Yb^{3+}$ and A is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$.

22. A long persistent phosphor represented by the formula:

$$M_vAl_xSi_yO_z:dD, cC, aA$$

wherein M is an alkaline earth metal, D is a donor ion, A is an acceptor ion, C is a co activator ion $v>0$, $x\geq 0$, $y\geq 0$, $x+y>0$, $z>0$, $0<d\leq 10\%$, $0<c\leq 10\%$ and $0<a\leq 10\%$ and the phosphor emits light largely characteristic of the acceptor ion, wherein the phosphor is a ceramic body or a single crystal.

23. A phosphorescent article comprising the phosphor of claim 14 embedded in a matrix which does not substantially react with the phosphor.

24. A method for generating long persistent phosphorescence comprising the steps of:
a) providing a phosphor of claim 14; and
b) irradiating the phosphor such that long persistent phosphorescence is produced.

25. A composition of the formula:

$$MSiO_3:dD, cC, aA$$

wherein M is an alkaline-earth metal, D is a donor ion, A is an acceptor ion, C is a co activator ion, $0<d\leq 10\%$, $0\leq c\leq 10\%$ and $0<a\leq 10\%$.

26. The phosphor of claim 25 wherein D is selected from the group consisting of $Ce^{3+}$, $Pr^{3+}$, $Sm^{3+}$, $Eu^{2+}$, $Dy^{3+}$, and $Yb^{3+}$ and A is selected from the group consisting of $Pr^{3+}$, $Nd^{3+}$, $Eu^{3+}$, $Tb^{3+}$, $Er^{3+}$, $Tm^{3+}$, $Ti^{2+}$, $Cr^{3+}$, $Mn^{2+}$, $Ni^{2+}$, $Pb^+$, and $Bi^{3+}$.

27. A composition of the formula:

$$MAl_2O_4:dCe, aMn$$

wherein M is on alkaline earth metal, $0<d\leq 10\%$ and $0<a\leq 10\%$.

28. A composition of the formula:

$$M_2Al_2SiO_7:dCe, aMn$$

wherein M is an alkaline earth metal, $0<d\leq 10\%$ and $0<a\leq 10\%$.

29. A composition of the formula:

$$MSiO_3:dEu, aMn, cDy$$

wherein M is an alkaline earth metal, $0<d\leq 10\%$, $0<a\leq 10\%$ and $0\leq c\leq 10\%$.

30. The phosphor of claim 29 wherein M is magnesium.

31. A method for making a long persistent phosphor comprising the steps of:
a) combining the phosphor components according to the stoichiometry of the formula:

$$v(MO).(x/2)(Al_2O_3).y(SiO_2):dD, cC, aA$$

where M is an alkaline-earth metal, D is a donor ion, C is a co activator ion, A is an acceptor ion, v and y are 1, x is 0, $0<d\leq 10\%$, $0<c\leq 10\%$ and $0<a\leq 10\%$; and
b) sintering the phosphor components.

32. A long persistent phosphor represented by the formula:

$$M_vAl_xSi_yO_z:dD, cC, aA$$

wherein M is an alkaline earth metal, D is $Ce^{3+}$, A is $Mn^{2+}$, and C is a co activator ion, v is 1, x is 2, y is 0, $z>0$, $0<d\leq 10\%$, $0\leq c\leq 10\%$ and $0<a\leq 10\%$ and the phosphor emits light largely characteristic of the acceptor ion.

33. A phosphor composition comprising an alkaline-earth aluminate or an alkaline-earth aluminosilicate host doped with a donor, co-activator, and an acceptor, wherein the donor ion persistently transfers absorbed energy to a trap center formed by the co-activator and the trap center persistently transfers energy to the acceptor causing the acceptor to persistently emit.

34. A long persistent phosphor composition comprising an alkaline-earth aluminate or an alkaline-earth aluminosilicate host doped with a plurality of ions, wherein the phosphor composition has a peak emission wavelength of about 585 nm or more.

35. A long persistent phosphor represented by the formula:

$$MAl_2SiO_7:dD, cC, aA$$

wherein M is an alkaline earth metal, D is a donor ion, A is an acceptor ion, C is a co-activator ion, $0<d\leq 10\%$, $0<c\leq 10\%$ and $0<a\leq 10\%$ and the phosphor emits light largely characteristic of the acceptor ion.

36. The phosphor of claim 35 wherein D is $Ce^{3+}$ and A is $Mn^{2+}$.

* * * * *